(12) United States Patent
Chen et al.

(10) Patent No.: US 12,288,491 B2
(45) Date of Patent: Apr. 29, 2025

(54) DISPLAY DETECTION DEVICE, DETECTION METHOD, AND DETECTION SYSTEM

(71) Applicant: AUO Corporation, Hsin-Chu (TW)

(72) Inventors: Te-Sheng Chen, Hsin-Chu (TW); June-Woo Lee, Hsin-Chu (TW); Bo-Kai Liao, Hsin-Chu (TW); Mei-Yi Li, Hsin-Chu (TW); Yu-Chieh Kuo, Hsin-Chu (TW); Chun-Chang Hung, Hsin-Chu (TW); Shang-Chieh Chou, Hsin-Chu (TW); You-Ru Lyu, Hsin-Chu (TW); Yu-Hsun Lin, Hsin-Chu (TW); Chun-Shuo Chen, Hsin-Chu (TW)

(73) Assignee: AUO CORPORATION, Hsin-Chu (TW)

(*) Notice: Subject to any disclaimer, the term of this patent is extended or adjusted under 35 U.S.C. 154(b) by 92 days.

(21) Appl. No.: 18/148,155

(22) Filed: Dec. 29, 2022

(65) Prior Publication Data
US 2023/0419872 A1  Dec. 28, 2023

(30) Foreign Application Priority Data
Jun. 22, 2022  (TW) .................................. 111123292
Dec. 16, 2022  (TW) .................................. 111148567

(51) Int. Cl.
*G09G 3/00* (2006.01)
*G01R 31/52* (2020.01)

(52) U.S. Cl.
CPC ............. *G09G 3/006* (2013.01); *G01R 31/52* (2020.01)

(58) Field of Classification Search
CPC .................................. G01R 31/52; G09G 3/00
See application file for complete search history.

(56) References Cited

U.S. PATENT DOCUMENTS

2019/0018057 A1  1/2019  Pappas
2022/0214394 A1*  7/2022  Qiu ..................... G01R 31/2815

FOREIGN PATENT DOCUMENTS

| CN | 105182209 B | 1/2018 |
| CN | 212905014 U | 4/2021 |
| TW | 201909300 A | 3/2019 |
| TW | I679433 B | 12/2019 |

* cited by examiner

*Primary Examiner* — Stacy Khoo
(74) *Attorney, Agent, or Firm* — WPAT, PC

(57) ABSTRACT

A display detection device includes a panel, a detection board, and a detection adapter board. The panel is configured to display. The detection board is coupled to the panel, and is configured to input a detection signal. The detection adapter board is coupled to the panel, and is configured to respond to the detection signal to generate a detection result.

18 Claims, 5 Drawing Sheets

DISPLAY DETECTION DEVICE, DETECTION METHOD, AND DETECTION SYSTEM

CROSS-REFERENCE TO RELATED APPLICATION

This application claims priority to Taiwan Application Serial Number 111123292, filed on Jun. 22, 2022, and Taiwan Application Serial Number 111148567, filed on Dec. 16, 2022, all of which are herein incorporated by reference in their entireties.

BACKGROUND

Field of Invention

The present disclosure relates to a display detection field. More particularly, the present disclosure relates to a display detection device, a detection method, and a detection system.

Description of Related Art

Conventional display detection devices are designed to form a closed detection loop by controlling transistors of panel array circuits to measure current or voltage so as to determine whether transistors of panel array circuits are damaged. However, using a method of measuring current or voltage will not be able to be detected because damage of the transistor is less serious, such as a small leakage. Therefore, control transistors form a closed detection loop, and a method of measuring current or voltage to determine whether transistors of panel array circuits are damaged cannot fully simulate a situation of a panel.

Furthermore, since a cost of the micro-LEDs in a display device is expensive, micro-LEDs may be damaged during a detection process.

For the foregoing reason, there is a need to provide a design of a detection circuit to solve the problems of the prior art.

SUMMARY

One aspect of the present disclosure provides a display detection device. The display detection device includes a panel, a detection board, and a detection adapter board. The panel is configured to display. The detection board is coupled to the panel, and is configured to input a detection signal. The detection adapter board is coupled to the panel, and is configured to generate a detection result in response to the detection signal.

Another aspect of the present disclosure provides a detection method. The detection method includes following steps: combining a detection loop of a detection adapter board to a panel of a display detection device; inputting a detection signal to the panel by a detection board of the display detection device; and generating a detection result in response to the detection signal by the detection loop of the detection adapter board.

Another aspect of the present disclosure provides a detection system. The detection system is configured to test a display detection device. The detection system includes a display detection device and a test equipment. The display detection device includes a panel, a detection board, and a detection adapter board. The panel is configured to display, and is configured to transmit a detection signal from a lighting fixture of the detection system. The detection board is coupled to the panel, and is configured to transmit the detection signal of the panel. The detection adapter board is coupled to the panel, and is configured to generate a detection result in response to the detection signal. The test equipment includes a probe platform and a sensor. The probe platform is configured to position and calibrate the panel of the display detection device. The sensor is coupled to the probe platform, and is configured to capture the detection result of the detection adapter board to generate a feature image so as to evaluate whether the display detection device is abnormal according to the feature image.

BRIEF DESCRIPTION OF THE DRAWINGS

The present disclosure can be more fully understood by reading the following detailed description of the embodiment, with reference made to the accompanying drawings as follows.

DETAILED DESCRIPTION

Figure 1:
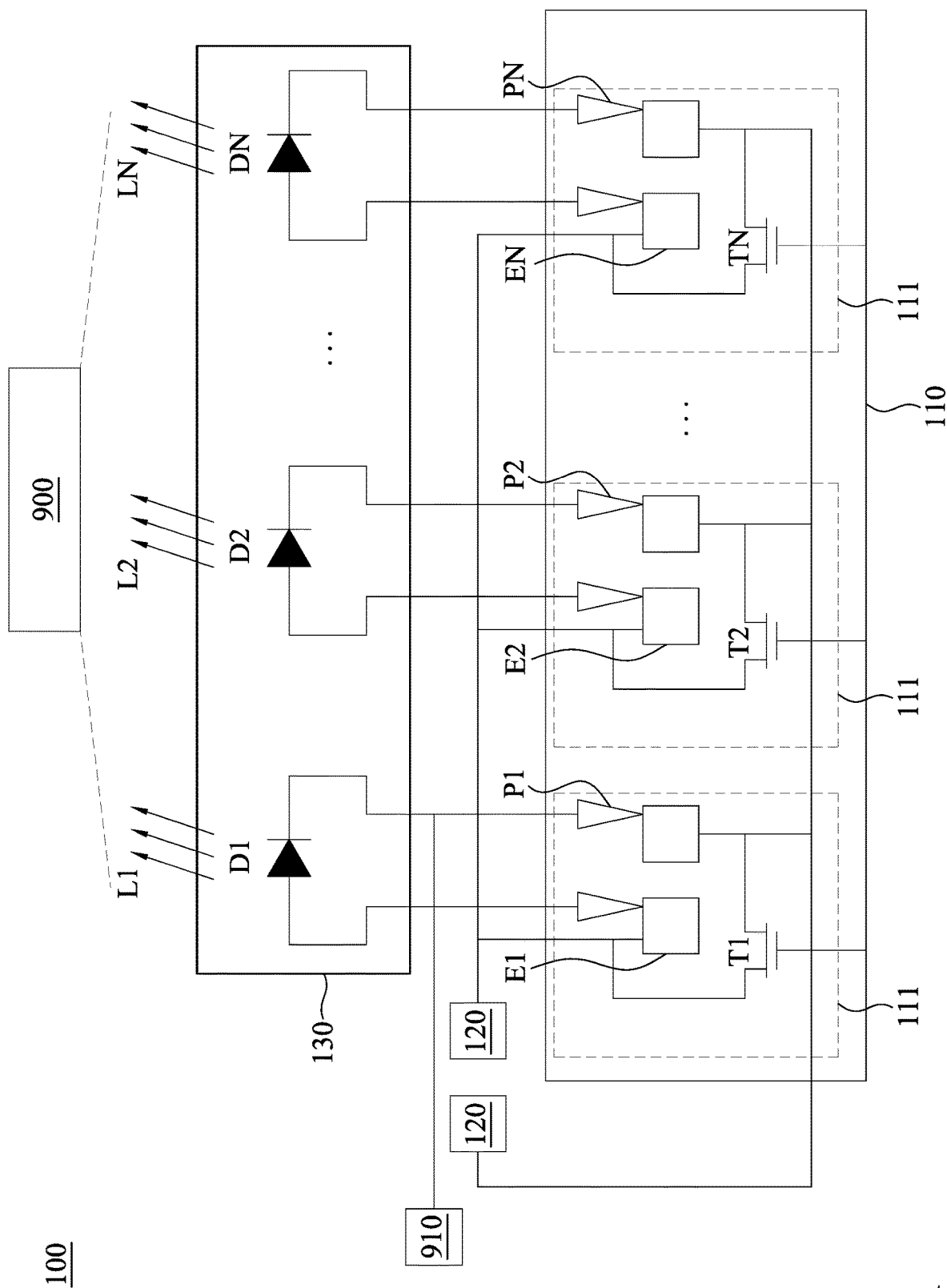
FIG. 1 depicts a schematic diagram of a display detection device according to some embodiments of the present disclosure.

Reference will now be made in detail to the present embodiments of the invention, examples of which are illustrated in the accompanying drawings. Wherever possible, the same reference numbers are used in the drawings and the description to refer to the same or like parts.

The terminology used herein is for the purpose of describing particular example embodiments only and is not intended to be limiting of the present disclosure. As used herein, the singular forms "a," "an" and "the" are intended to include the plural forms as well, unless the context clearly indicates otherwise.

Furthermore, it should be understood that the terms, "comprising", "including", "having", "containing", "involving" and the like, used herein are open-ended, that is, including but not limited to.

The terms used in this specification and claims, unless otherwise stated, generally have their ordinary meanings in the art, within the context of the disclosure, and in the specific context where each term is used. Certain terms that are used to describe the disclosure are discussed below, or elsewhere in the specification, to provide additional guidance to the practitioner skilled in the art regarding the description of the disclosure.

FIG. 1 depicts a schematic diagram of a display detection device 100 according to some embodiments of the present disclosure. In some embodiments, please refer to FIG. 1, the display detection device 100 includes a panel 110, a detection board 120, and a detection adapter board 130. In some embodiments, the panel 110 includes a plurality of panel array circuits 111.

In some embodiments, the panel 110 is configured to display. The detection board 120 is coupled to the panel 110 and is configured to input a detection signal. The detection adapter board 130 is directly or indirectly coupled to the panel 110, and is configured to generate a detection result in response to the detection signal.

In some embodiments, the plurality of panel array circuits 111 are configured to display.

In some embodiments, each of the panel array circuits 111 includes a control transistor (e.g.: control transistor T1) and paired electrode plates (e.g.: electrode plates E1). It should be noted that a space is formed between the paired electrode plates E1, and the space of the paired electrode plates E1 is configured to set a luminous element. It is further explained that the plurality of panel array circuits 111 cannot be displayed during a detection process because no luminous element are installed. Therefore, the panel 110 of the present disclosure is displayed as a full dark picture.

In some embodiments, the detection adapter board 130 includes a plurality of detection loops (e.g.: a loop of the detection diode D1 coupled to one of the panel array circuits 111 through a thin film probe P1, a loop of the detection diode D2 coupled to one of the panel array circuits 111 through a thin film probe P2, and a loop of the detection diode DN coupled to one of the panel array circuits 111 through a thin film probe PN). Each of the plurality of detection loops is coupled to each of the panel array circuits 111 respectively and is configured to generate the detection result in response to the detection signal. The detection result is captured by an optical detection system 900 for analysis.

In some embodiments, each of the detection loops includes at least one thin film probe (e.g.: the thin film probe P1) and a detection diode (e.g.: the detection diode D1). It should be noted that the detection loop on the far left in the figure is mainly used as an example, and each of the detection loops is all the same. Thin film probe (e.g.: a thin film probe P1) is coupled to ach of the plurality of detection loops and each of the plurality of panel array circuits 111 to form a closed loop. The detection diode D1 is coupled to the thin film probe P1, and is configured to emit a light so as to determine whether the plurality of panel array circuits 111 of the panel 110 are abnormal according to the detection signal.

In some embodiments, when the panel 110 displays a full dark picture, the detection diode of each of the plurality of panel array circuits is configured to determine whether each of the plurality of panel array circuits 111 generates a leakage current according to the detection signal. It should be noted that the panel 110 is usually driven by the control transistors T1 to TN of the plurality of panel array circuits 111. Under the full dark picture, the control transistors T1 to TN do not drive the panel 110 according to the control signal of the display detection device 100.

In some embodiments, if one of the plurality of panel array circuits 111 generates the leakage current, the detection diode (e.g.: the detection diode D1, the detection diode D2, and a detection diode D3) is configured to emit a light to generate a plurality of light intensities (e.g.: a first light intensity L1, a second light intensity L2 to a Nth light intensity LN) according to a magnitude of the leakage current.

In some embodiments, if the plurality of panel array circuits 111 do not generate the leakage current, the detection adapter board 130 is performed a voltage detection or a current detection on through an electrical detection board 910 outside the display detection device 100 to determine whether each of the plurality of panel array circuits 111 is defective. It should be noted that the electrical detection board 910 outside the display detection device 100 is additionally electrically connected to the plurality of detection loops. After testing, the electrical detection board 910 will be removed.

Figure 2:
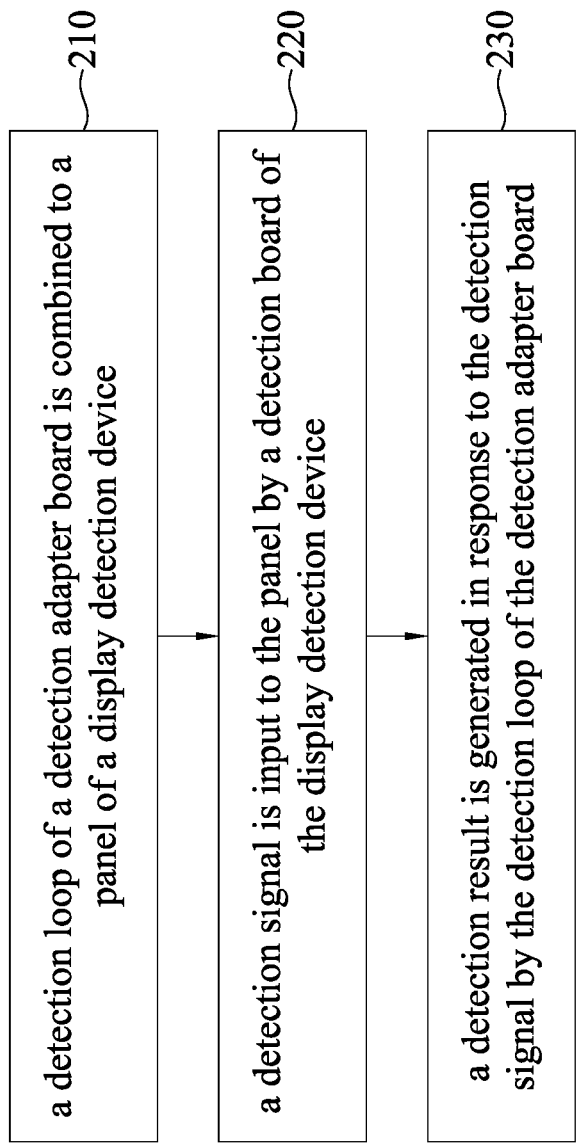
FIG. 2 depicts a flow diagram of a detection method according to some embodiments of the present disclosure.

In some embodiments, in order to facilitate the understanding of an operation of the display detection device 100, please refer to FIG. 1 to FIG. 2, FIG. 2 depicts a flow diagram of a detection method 200 according to some embodiments of the present disclosure. In some embodiments, the detection method 200 can be executed by the display detection device 100 of FIG. 1. Steps of the detection method 200 of the present disclosure are described later.

In step 210, a detection loop of a detection adapter board is combined to a panel of a display detection device. In some embodiments, please refer to FIG. 1 to FIG. 2, take a circuit on the far left of FIG. 1 as an example, at least one thin film probe P1 of the of the detection loop of the detection adapter board 130 is coupled to one of a plurality of panel array circuits 111 of the panel 110 to form a closed loop.

In step 220, a detection signal is input to the panel by a detection board of the display detection device. In some embodiments, please refer to FIG. 1 to FIG. 2, take a circuit on the far left of FIG. 1 as an example, when the panel 110 displays a full dark picture, the detection signal is input to the panel 110 by the detection board 120 of the display detection device 100, and the detection result is generated in response to the detection signal by the detection diode D1 of the detection loop of the detection adapter board 130.

In some embodiments, please refer to FIG. 1, the panel 110 of the display detection device 100 includes a first area and a second area (not shown in the figure). The first area and the second area do not overlap to each other. In some embodiments, the detection signal is input to the first area and the second area by the detection board 120 of the display detection device 100 respectively. In some embodiments, the detection signal is input to the first area and the second area by the detection board of the display detection device simultaneously. It should be noted that the panel 110 usually includes arrays of display pixels. The arrays of display pixels are usually composed of a plurality of rows and columns. The "area" here refers to a column, a row, or a region of interest (ROI). A shape and a size of the area are design by a user according to actual needs and are not limited to embodiment of the present disclosure.

In some embodiments, please refer to FIG. 1, the detection signal is input to the first area and the second area (not shown in the figure) by the detection board 120 of the display detection device 100.

In step 230, a detection result is generated in response to the detection signal by the detection loop of the detection adapter board. In some embodiments, please refer to FIG. 1 to FIG. 2, take a circuit on the far left of FIG. 1 as an example, the detection diode D1 is configured to determine whether the far left panel array circuit 111 of the panel 110 generates a leakage current according to the detection signal.

Then, if one of the plurality of panel array circuits 111 generates the leakage current, the detection diode D1 is configured to emit a light to generate a plurality of light intensities (e.g.: the first light intensity L1) according to a magnitude of the leakage current.

Further, if the plurality of panel array circuits 111 do not generate the leakage current, a voltage detection or a current detection is performed on the detection adapter board 130 to determine whether each of the plurality of panel array circuits 111 is defective by an electrical detection board 910 outside the display detection device 100.

Figure 3:
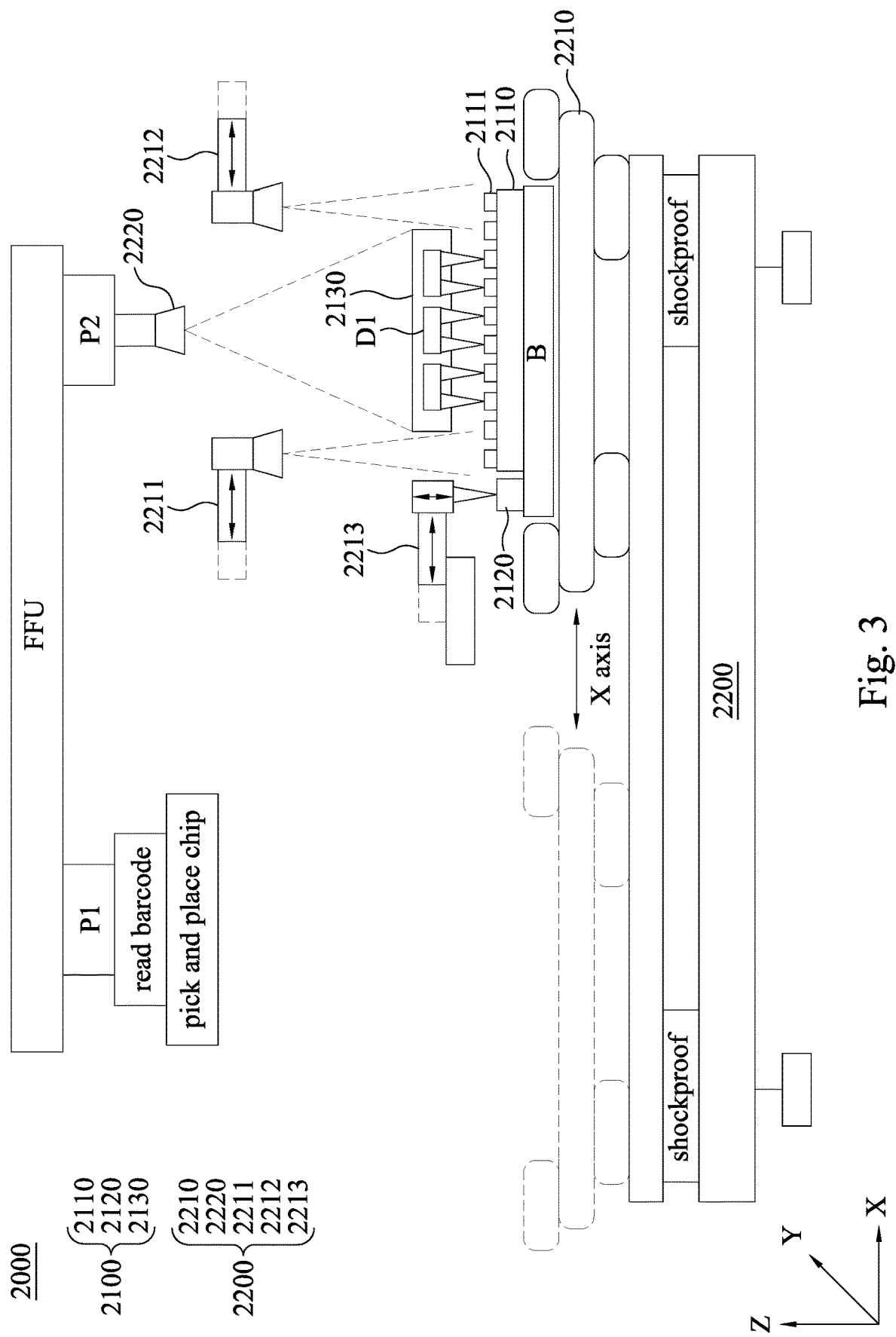
FIG. 3 depicts a schematic diagram of a detection system according to some embodiments of the present disclosure.

FIG. 3 depicts a schematic diagram of a detection system 2000 according to some embodiments of the present disclosure. In some embodiments, please refer to FIG. 3, the detection system 2000 is configured to test a display detection device 2100. Then detection system 2000 includes the display detection device 2100 and a test equipment 2200.

In some embodiments, the display detection device 2100 includes a panel 2110, a detection board 2120, and a detection adapter board 2130. The panel 2110 is configured to display, and is configured to transmit a detection signal from a lighting fixture (not shown in the figure) of the detection system 2000. The detection board 2120 is coupled to the panel 2110, and is configured to transmit the detection signal from the panel 2110. The detection adapter board 2130 is directly or indirectly coupled to the panel 2110, and is configured to generate a detection result in response to the detection signal.

In some embodiments, the test equipment 2200 includes a probe platform 2210, a sensor 2220, and auxiliary sensors 2211-2213. The probe platform 2210 is configured to position and calibrate the panel 2110 of the display detection device 2100. The sensor 2220 is coupled to the probe platform 2210, and is configured to capture the detection result of the detection adapter board 2130, to generate a feature image so as to evaluate whether the display detection device 2100 is abnormal according to the feature image.

It should be noted that the display detection device 2100 of FIG. 3 responds to the display detection device 100 of FIG. 1, rests of a structure and an operation have been explained in the above paragraphs, and repetitious details are omitted herein.

In some embodiments, the test equipment 2200 can be an automated optical inspection (AOI) system. The test equipment 2200 is configured to capture an optical image of the detection result of the detection adapter board 2130 of the display detection device 2100 through the sensor 2220 to convert information such brightness, color, pixel distribution into digital image signals. Then a computer and a program are configured to perform various mathematical operations on the digital image signals to extract features of a target, analyze and interpret an image content so as to output results according to a preset tolerance and other requirements conditions. In this way, the panels 2110 is detected by detecting the light intensities (e.g.: the first intensity L1, the second intensity L2 to the Nth intensity LN) of the detection diodes D1~DN of the detection adapter board 2130.

Figure 4:
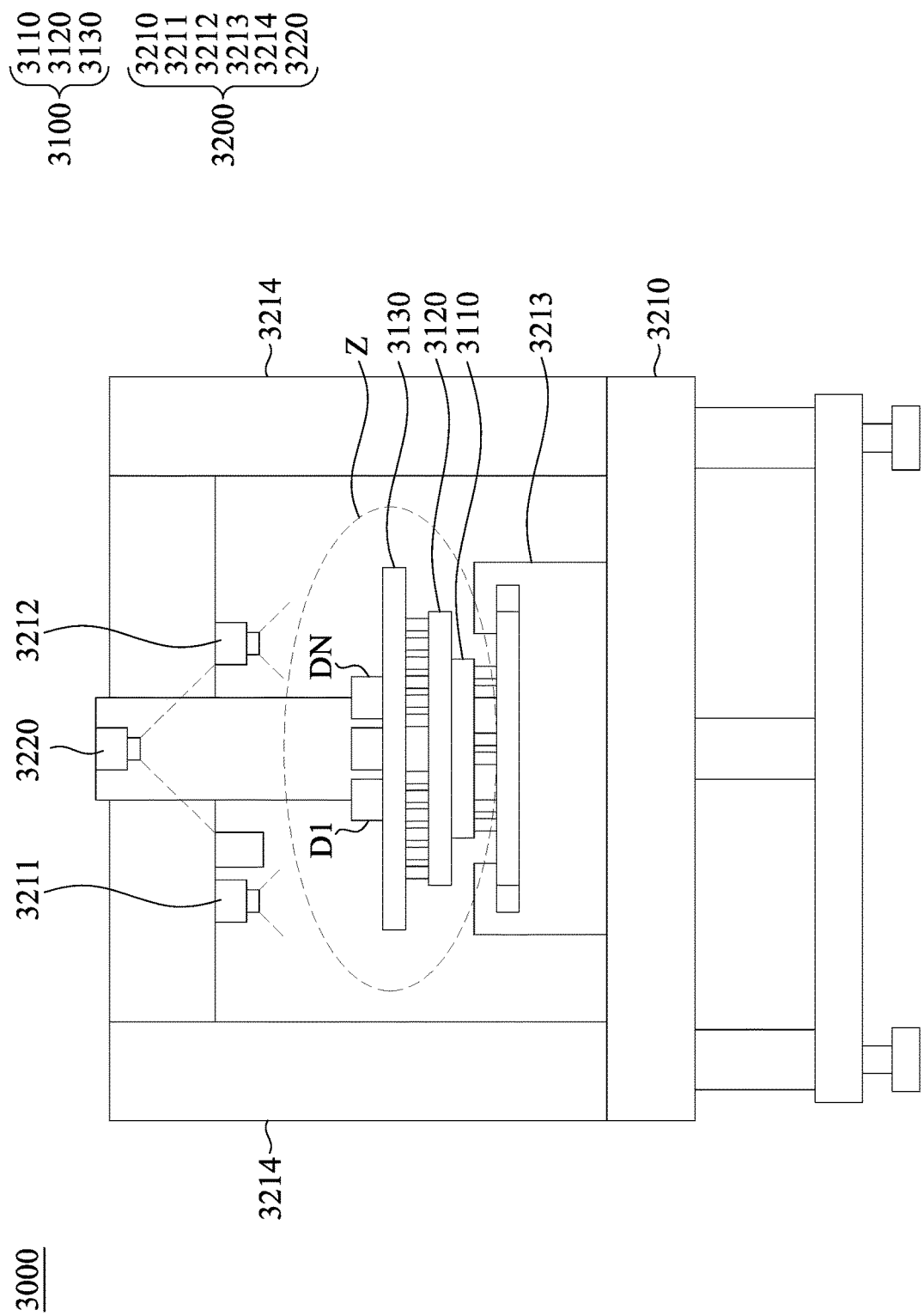
FIG. 4 depicts a schematic diagram of a detection system according to some embodiments of the present disclosure.

FIG. 4 depicts a schematic diagram of a detection system 3000 according to some embodiments of the present disclosure. In some embodiments, please refer to FIG. 4, a difference between the detection system 3000 of FIG. 4 and the detection system 2000 of FIG. 3 is that a position of a detection board 3120 is changed and a probe platform 3210 of a test equipment 3200 includes a lighting fixture 3213 and an aluminum extruded bracket 3214, and rest of the structure is similar to the detection system 2000 of FIG. 3.

In some embodiments, the detection system 3000 includes a display detection device 3100 and the test equipment 3200. In some embodiments, the display detection device 3100 includes a panel 3110, a detection board 3120, and a detection adapter board 3130. In some embodiments, the test equipment 3200 includes a probe platform 3210, a detection sensor 3220, an alignment sensor 3211 and an alignment sensor 3212, the lighting fixture 3213, and the aluminum extruded bracket 3214.

In some embodiments, the panel 3110 is configured to display, and is configured to transmit a detection signal from the lighting fixture 3213 of the probe platform of probe platform 3210 of the test equipment 3200 of the detection system 3000. The detection board 3120 is coupled to the panel 3110, and is configured to transmit the detection signal from the panel 3110. The detection adapter board 3130 is indirectly coupled to the pane 3110 through the detection board 3120, and is configured to generate a detection result in response to the detection signal.

In some embodiments, the lighting fixture 3213 of the probe platform 3210 is configured to generate the detection signal to the panel 3110, and then transmit the detection signal to the detection diode D1 to the detection diode DN of the detection adapter board 3130 through the detection board 3120.

In some embodiments, the detection sensor 3220, the alignment sensor 3211, and the alignment sensor 3212 are disposed on the aluminum extruded bracket 3214.

Figure 5:
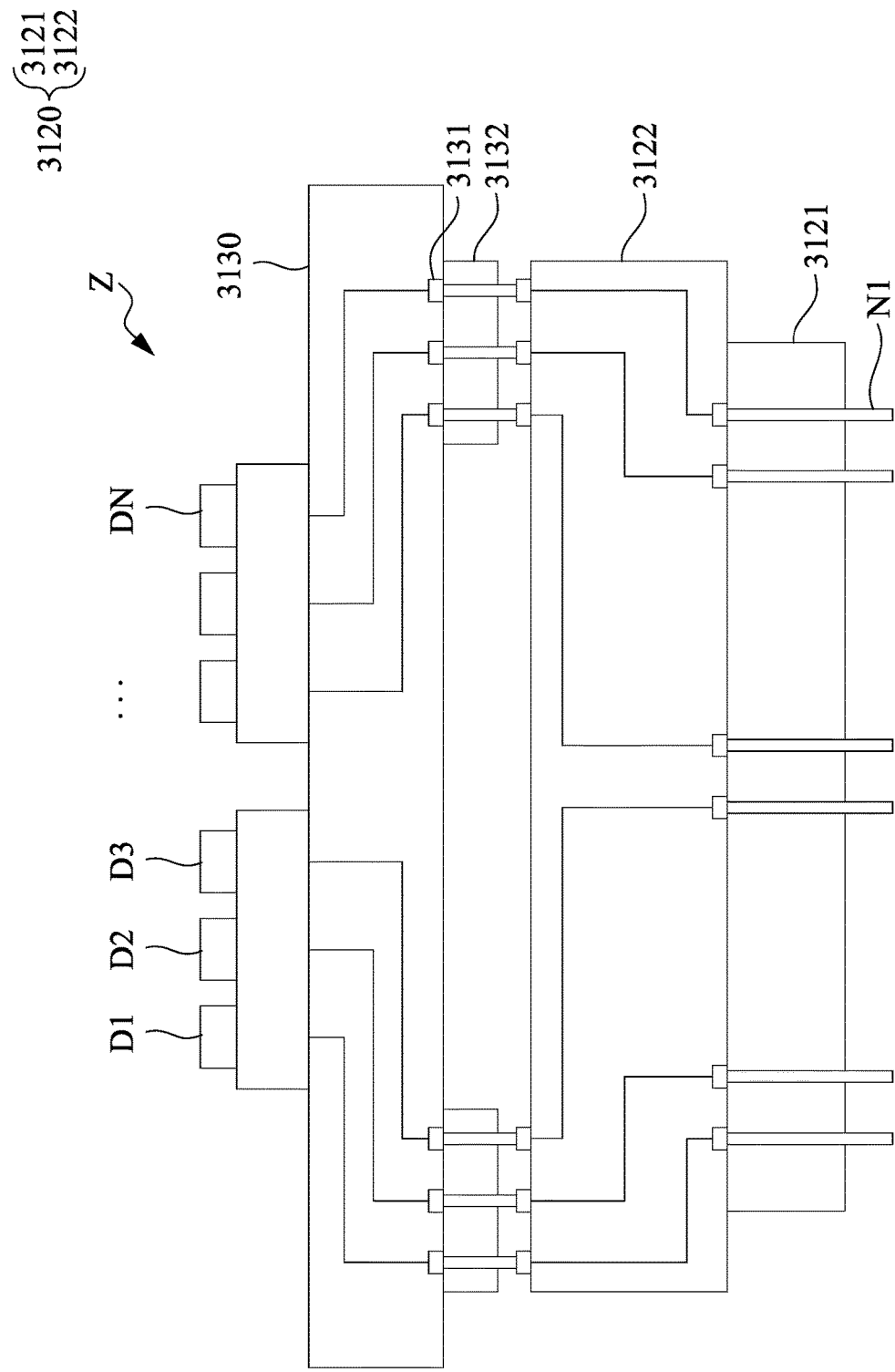
FIG. 5 depicts an enlarged schematic diagram of a partial area of a detection system according to some embodiments of the present disclosure.

FIG. 5 depicts an enlarged schematic diagram of a partial area Z of a detection system 3000 of FIG. 4 according to some embodiments of the present disclosure. In some embodiments, please refer to FIG. 4 and FIG. 5, the detection board 3120 further includes a probe head 3121 and a probe card printed circuit board 3122. The probe head 3121 includes a plurality of needles N1. Bottoms of the plurality of needles N1 are in contact with the panel 3110 of FIG. 4 (not shown in the figure). Tops of the plurality of needles N1 are in contact with the probe card printed circuit board 3122. The probe card printed circuit board 3122 includes a plurality of sets of lines connecting the panel 3110 and the detection adapter board 3130 of FIG. 4.

In some embodiments, the detection adapter board 3130 includes the detection diode D1 to the detection diode DN, pogo pins 3131 and a printed circuit board 3132. The detection adapter board 3130 includes a plurality of sets of lines extending from the panel 3110 of FIG. 4. Bottoms of the detection adapter board 3130 is connected by the pogo pins 3131. Tops of the pogo pins 3131 are in contact with the printed circuit board 3132 of the detection adapter board 3130.

In some embodiments, please refer to FIG. 3 to FIG. 5, positions of the detection diode D1 to the detection diode DN of FIG. 5 correspond to positions of a plurality of panel array circuits (or called pixels) of the panel 3110 of FIG. 4, which position corresponding manner is similar to a position corresponding manner of the plurality of panel array circuits 2111 and the detection diode D1 of the detection adapter board 2130 of FIG. 3. Therefore, the panel 3110 of FIG. 4 can be detected by the light intensities of the detection diode D1 to the detection diode DN.

Based on the above embodiments, the present disclosure provides a display detection device, a detection method, and a detection system so as to detect whether a circuit in a panel generates a leakage current under a full dark picture, and determine defects of a panel according a light intensity converted by a leakage current.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the present disclosure. In view of the foregoing, it is intended that the present disclosure cover modifications and variations of the present disclosure provided they fall within the scope of the following claims.

What is claimed is:

1. A display detection device, comprising:
a panel, configured to display;

a detection board, coupled to the panel, and configured to input a detection signal; and a detection adapter board, coupled to the panel, and configured to generate a detection result in response to the detection signal, wherein the detection adapter board and the panel are coupled to form a closed loop through at least one thin film probe of each of a plurality of detection loops, wherein when the panel displays a full dark picture, a detection diode of each of the plurality of detection loops is configured to determine whether each of a plurality of panel array circuits generates a leakage current according to the detection signal.

2. The display detection device of claim 1, wherein the panel comprises:

the plurality of panel array circuits, configured to display.

3. The display detection device of claim 2, wherein the detection adapter board comprises:

the plurality of detection loops, coupled to each of the panel array circuits respectively, and configured to generate the detection result in response to the detection signal.

4. The display detection device of claim 3, wherein each of the detection loops comprises:

the at least one thin film probe, coupled to each of the plurality of detection loops and each of the plurality of panel array circuits to form the closed loop; and the detection diode, coupled to the at least one thin film probe, and configured to emit a light so as to determine whether the plurality of panel array circuits of the panel are abnormal according to the detection signal.

5. The display detection device of claim 4, wherein if one of the plurality of panel array circuits generates the leakage current, the detection diode is configured to emit a light to generate a plurality of light intensities according to a magnitude of the leakage current.

6. The display detection device of claim 4, wherein if the plurality of panel array circuits do not generate the leakage current, the detection adapter board performs a voltage detection or a current detection through an electrical detection board outside the display detection device to determine whether each of the plurality of panel array circuits is defective.

7. A detection method, comprising:

combining a detection loop of a detection adapter board to a panel of a display detection device, wherein the detection adapter board and the panel are coupled to each other to form a closed loop through at least one thin film probe of the detection loop;

inputting a detection signal to the panel by a detection board of the display detection device; and generating a detection result in response to the detection signal by the detection loop of the detection adapter board, wherein inputting the detection signal to the panel by the detection board of the display detection device comprises:

inputting the detection signal to the panel by the detection board of the display detection device and generating the detection result in response to the detection signal by a detection diode of the detection loop of the detection adapter board when the panel displays a full dark picture.

8. The detection method of claim 7, wherein combining the detection loop of the detection adapter board to the panel of the display detection device comprises:

coupling the at least one thin film probe of the detection loop of the detection adapter board to one of a plurality of panel array circuits of the panel to form the closed loop.

9. The detection method of claim 7, wherein generating the detection result in response to the detection signal by the detection loop of the detection adapter board comprises:

determining whether a plurality of panel array circuits of the panel generate a leakage current according to the detection signal by the detection diode; and emitting a light to generate a plurality of light intensities by the detection diode according to a magnitude of the leakage current if one of the plurality of panel array circuits generates the leakage current.

10. The detection method of claim 7, wherein generating the detection result in response to the detection signal by the detection loop of the detection adapter board further comprises:

performing a voltage detection or a current detection on the detection adapter board to determine whether each of a plurality of panel array circuits is defective by an electrical detection board outside the display detection device if the plurality of panel array circuits do not generate a leakage current.

11. The detection method of claim 7, wherein the panel of the display detection device comprises a first area and a second area, wherein the first area and the second area do not overlap to each other, wherein inputting the detection signal to the panel by the detection board of the display detection device comprises:

inputting the detection signal to the first area and the second area by the detection board of the display detection device respectively.

12. The detection method of claim 11, wherein inputting the detection signal to the panel by the detection board of the display detection device further comprises:

inputting the detection signal to the first area and the second area by the detection board of the display detection device simultaneously.

13. A detection system, comprising:

a display detection device, comprising:

a panel, configured to display, and configured to transmit a detection signal from a lighting fixture of the detection system;

a detection board, coupled to the panel, and configured to transmit the detection signal from the panel; and a detection adapter board, coupled to the panel, and configured to generate a detection result in response to the detection signal; and a test equipment, comprising:

a probe platform, configured to position and calibrate the panel of the display detection device; and a sensor, coupled to the probe platform, and configured to capture the detection result of the detection adapter board to generate a feature image so as to evaluate whether the display detection device is abnormal according to the feature image.

14. The detection system of claim 13, wherein the panel comprises:

a plurality of panel array circuits, configured to display.

15. The detection system of claim 14, wherein the detection adapter board comprises:

a plurality of detection loops, coupled to each of the panel array circuits respectively, and configured to generate the detection result in response to the detection signal.

16. The detection system of claim 15, wherein each of the detection loops comprises:

at least one thin film probe, coupled to each of the plurality of detection loops and each of the plurality of panel array circuits to form a closed loop; and a detection diode, coupled to the at least one thin film probe, and configured to emit a light so as to determine whether the plurality of panel array circuits of the panel are abnormal according to the detection signal.

17. The detection system of claim 16, wherein when the panel displays a full dark picture, the detection diode of each of the plurality of panel array circuits is configured to determine whether each of the plurality of panel array circuits generates a leakage current according to the detection signal, wherein if one of the plurality of panel array circuits generates the leakage current, the detection diode is configured to emit a light to generate a plurality of light intensities according to a magnitude of the leakage current, and the sensor of the test equipment is further configured to generate the feature image according to the plurality of light intensities.

18. The detection system of claim 17, wherein if the plurality of panel array circuits do not generate the leakage current, the detection adapter board is performed a voltage detection or a current detection on through an electrical detection board outside the display detection device to determine whether each of the plurality of panel array circuits is defective.

* * * * *